US012757784B2

(12) United States Patent
Chen et al.

(10) Patent No.: US 12,757,784 B2
(45) Date of Patent: Oct. 6, 2026

(54) PACKAGE STRUCTURE WITH WETTABLE SIDE SURFACE AND MANUFACTURING METHOD THEREOF, AND VERTICAL PACKAGE MODULE

(71) Applicant: Zhuhai ACCESS Semiconductor Co., Ltd., Guangdong (CN)

(72) Inventors: Xianming Chen, Guangdong (CN); Lei Feng, Guangdong (CN); Benxia Huang, Guangdong (CN); Wenshi Wang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 627 days.

(21) Appl. No.: 17/663,208

(22) Filed: May 12, 2022

(65) Prior Publication Data

US 2022/0392862 A1 Dec. 8, 2022

(30) Foreign Application Priority Data

Jun. 3, 2021 (CN) ......................... 202110618463.4

(51) Int. Cl.
*H10W 90/00* (2026.01)
*H10W 40/22* (2026.01)
(Continued)

(52) U.S. Cl.
CPC ........... *H10W 90/00* (2026.01); *H10W 40/22* (2026.01); *H10W 70/68* (2026.01);
(Continued)

(58) Field of Classification Search
CPC ... H01L 2224/0801; H01L 2224/08111; H01L 2224/09103; H01L 2224/16013;
(Continued)

(56) References Cited

U.S. PATENT DOCUMENTS

2007/0278701 A1 12/2007 Chang et al.
2008/0197478 A1* 8/2008 Yang .................... H01L 21/568 438/119
(Continued)

FOREIGN PATENT DOCUMENTS

CN 101587847 A 11/2009
CN 103280424 A 9/2013
(Continued)

OTHER PUBLICATIONS

Search Report of Chinese Patent Application No. 2021106184634 issued Mar. 9, 2022, 5 pages with translations.
(Continued)

*Primary Examiner* — Khaja Ahmad
(74) *Attorney, Agent, or Firm* — Buchalter; Jason W. Croft

(57) ABSTRACT

A package structure with a wettable side surface and a manufacturing method thereof, and a vertical package module are disclosed. The package structure includes a first dielectric layer, a chip and a circuit layer. The first dielectric layer is provided with a package cavity, side wall bonding pads are arranged on a side wall of the first dielectric layer and located outside the package cavity. The chip is packaged inside the package cavity, pins of the chip face first surface of the first dielectric layer. The circuit layer is arranged on the first surface of the first dielectric layer, and the circuit layer is directly or indirectly connected to the side wall bonding pads and the pins of the chip.

2 Claims, 10 Drawing Sheets

(51) Int. Cl.

| | |
|---|---|
| ***H10W 70/68*** | (2026.01) |
| ***H10W 72/00*** | (2026.01) |
| ***H10W 72/20*** | (2026.01) |
| ***H10W 72/50*** | (2026.01) |
| ***H10W 72/90*** | (2026.01) |
| ***H10W 80/00*** | (2026.01) |

(52) U.S. Cl.
CPC ......... *H10W 72/247* (2026.01); *H10W 72/50* (2026.01); *H10W 72/07236* (2026.01); *H10W 72/07252* (2026.01); *H10W 72/07253* (2026.01); *H10W 72/07254* (2026.01); *H10W 72/221* (2026.01); *H10W 72/227* (2026.01); *H10W 72/234* (2026.01); *H10W 72/237* (2026.01); *H10W 72/926* (2026.01); *H10W 72/9415* (2026.01); *H10W 72/944* (2026.01); *H10W 80/721* (2026.01); *H10W 80/743* (2026.01); *H10W 90/724* (2026.01)

(58) Field of Classification Search
CPC ......... H01L 23/13; H01L 23/49; H01L 24/81; H01L 24/08–16
See application file for complete search history.

(56) References Cited

U.S. PATENT DOCUMENTS

| | | | | |
|---|---|---|---|---|
| 2009/0294914 | A1* | 12/2009 | Pagaila | H01L 21/6835 438/109 |
| 2013/0010441 | A1* | 1/2013 | Oganesian | H10W 20/092 361/752 |
| 2013/0307125 | A1* | 11/2013 | Huang | H10W 70/657 257/623 |
| 2015/0162309 | A1* | 6/2015 | Vincent | H01L 24/97 438/109 |
| 2016/0133608 | A1* | 5/2016 | Vincent | H01L 23/53204 257/773 |
| 2016/0181202 | A1* | 6/2016 | Gong | H01L 21/2855 257/750 |
| 2017/0133302 | A1 | 5/2017 | Truhitte et al. | |
| 2017/0338170 | A1 | 11/2017 | Ziglioli | |
| 2019/0109096 | A1* | 4/2019 | Wang | H01L 21/6835 |
| 2019/0164942 | A1* | 5/2019 | Ryu | H01L 23/3128 |
| 2020/0058622 | A1* | 2/2020 | Chen | H01L 24/73 |
| 2021/0257324 | A1* | 8/2021 | Park | H01L 24/73 |
| 2021/0375833 | A1* | 12/2021 | Lee | H10H 20/01 |
| 2023/0411348 | A1* | 12/2023 | Hanna | H01L 23/5385 |

FOREIGN PATENT DOCUMENTS

| | | | |
|---|---|---|---|
| CN | 104793298 | A | 7/2015 |
| CN | 107403765 | A | 11/2017 |
| CN | 107768323 | A | 3/2018 |
| CN | 111564374 | A | 8/2020 |
| CN | 111599797 | A | 8/2020 |
| CN | 111863775 | A | 10/2020 |
| CN | 112164677 | A | 1/2021 |
| CN | 112702836 | A | 4/2021 |
| JP | 2001177044 | A | 6/2001 |
| JP | 2002359343 | A | 12/2002 |
| JP | 2007227739 | A | 9/2007 |
| JP | 2008211254 | A | 9/2008 |
| JP | 2008244451 | A | 10/2008 |
| JP | 2009044160 | A | 2/2009 |
| JP | 2009054666 | A | 3/2009 |
| JP | 2009302221 | A | 12/2009 |
| JP | 2021052148 | A | 4/2021 |
| KR | 20190003293 | A | 1/2019 |
| TW | I634630 | B | 9/2018 |
| WO | 2010137841 | A2 | 12/2010 |
| WO | 2011111300 | A1 | 9/2011 |

OTHER PUBLICATIONS

Office Action of Chinese Patent Application No. 2021106184634 issued Mar. 16, 2022, 19 pages with translations.
Decision of Rejection of Chinese Patent Application No. 2021106184634 issued May 25, 2022, 14 pages with translations.
First Office Action of Japanese Patent Application No. 2022-073061 issued May 11, 2023, 12 pages with translations.
Second Office Action of Japanese Patent Application No. 2022-073061 issued Nov. 7, 2023, 10 pages with translations.
Third Office Action of Japanese Patent Application No. 2022-073061 issued Mar. 15, 2024, 8 pages with translations.
Decision to Grant a Patent of Japanese Patent Application No. 2022-073061 issued Aug. 5, 2024, 5 pages with translations.
First Office Action of Korean Patent Application No. 10-2022-0049760 issued Jul. 14, 2023, 12 pages with translations.
Second Office Action of Korean Patent Application No. 10-2022-0049760 issued Mar. 26, 2024, 10 pages with translations.
First Office Action and Search Report of Taiwanese Patent Application No. 111112537 issued on Sep. 26, 2022, 16 pages with translations.

* cited by examiner

PACKAGE STRUCTURE WITH WETTABLE SIDE SURFACE AND MANUFACTURING METHOD THEREOF, AND VERTICAL PACKAGE MODULE

CROSS-REFERENCE TO RELATED APPLICATION

This application is filed on the basis of Chinese patent application No. 2021106184634 filed Jun. 3, 2021, and claims priority of the Chinese patent application, the entire contents of which are incorporated herein by reference.

TECHNICAL FIELD

The disclosure relates to the technical field of semiconductor packaging, in particular to a package structure with a wettable side surface and a manufacturing method thereof, and a vertical package module.

BACKGROUND

In semiconductor packaging technologies, for bump flip-chip packaging technology based on metal bumps, or pin-based packaging technologies such as mounting and plug-in mounting, and wire bonding, etc., it is necessary to arrange metal bumps or leads on the chip as electrical connection points connected to a lead frame or an integrated circuit (IC) substrate. During the conduction of electrical signals, high loss and high delay occur due to extension of transmission distance and parasitic inductance existing between leads, and the package size cannot be miniaturized.

BGA (Ball Grid Array) or LGA (Land Grid Array) packaging technology is a common packaging technology in semiconductor packaging technologies. Such technology mainly lies in replacing the previous needle-shaped pins with metal contact packaging. However, it is generally difficult to directly judge solder joints from the appearance of the product, especially whether the performance of the solder joints at the bottom is acceptable, which thus affects the reliability and stability of the package product in applications.

With the increase in the number of inputs and outputs (I/Os), the wire bonding package method can no longer meet certain packaging requirements, and the package structure with a certain area also limits the increase in the number of solder balls on the substrate. Such problem is currently solved by redistributing circuit layers on the chip to increase the spacing to manufacture new electrical contacts, and then form a BGA or LGA package, which, however, will lead to a reduction in product yield and an increase in package costs. Moreover, since the bonding pads of the package are located at the bottom of the package, the device can only be mounted on a printed vertical package module in a manner of surface mounting, and the heat dissipation of the device needs to be transmitted downwards through the circuit or actively conducted from the back of the device. Therefore, it cannot be applied to scenarios of vertically assembled side surfaces and cannot meet the multi-directional transceiver function requirements of specific semiconductor special devices.

SUMMARY

The disclosure aims to solve at least one of the technical problems in the existing technology. To this end, the disclosure provides a package structure with a wettable side surface and a manufacturing method thereof, and a vertical package module, in which side wall bonding pads can be immersed with solder, circuit layer can be led out via chip pins, bonding wires or metal bumps are omitted, the package size is reduced, and the conduction distance of electric signals is shortened.

In a first aspect, a package structure with a wettable side surface according to the embodiment of the disclosure includes: a first dielectric layer provided with a package cavity, first side wall bonding pads being arranged on side walls of the first dielectric layer and located outside the package cavity; a chip packaged inside the package cavity, pins on an active surface of the chip facing a first surface of the first dielectric layer; and a circuit layer arranged on the first surface of the first dielectric layer and directly or indirectly connected to the first side wall bonding pads and the pins on the active surface of the chip.

The package structure according to the embodiment of the disclosure has at least the following beneficial effects.

Compared with existing package structures, according to the embodiment of the disclosure, first side wall bonding pads that can be immersed with solder are provided, the circuit layer is led out via the pins of the chip, bonding wires or metal bumps are omitted, the package size is reduced, and the conduction distance of electric signals is shortened, which facilitates the miniaturization of the package structure while minimizing any performance degradation, and the optimization for the loss and delay of electric signal conduction. When the first side wall bonding pads are immersed with solder, the solder wettability condition of the first side wall bonding pads can be checked by an automatic optical inspection device so as to judge the quality of the solder and then judge the validity of the chip solder performance, which is beneficial to improving the reliability of related electronic products after assembly, and can meet the requirements of vehicle regulations.

According to some embodiments of the disclosure, the circuit layer is directly connected to the first side wall bonding pads or connected to the first side wall bonding pads via second electrically conductive through-hole posts, and the circuit layer is further directly connected to the pins on the active surface of the chip or connected to the pins on the active surface of the chip via first electrically conductive through-hole posts.

According to some embodiments of the disclosure, the circuit layer is provided in plural, and two adjacent circuit layers are connected via third electrically conductive through-hole posts.

According to some embodiments of the disclosure, a heat dissipation layer is arranged on a second surface of the first dielectric layer, and the heat dissipation layer is directly connected to a heat dissipation surface of the chip or connected to the heat dissipation surface of the chip via first thermally conductive through-hole posts.

According to some embodiments of the disclosure, the circuit layer is provided with bottom bonding pads, and at least one of the first side wall pads and the bottom pads is placed with solder balls.

According to some embodiments of the disclosure, a functional area is arranged on the active surface of the chip, and the functional area is exposed out of the first dielectric layer.

According to some embodiments of the disclosure, a transparent second surface protective layer is arranged on the active surface of the chip.

According to some embodiments of the disclosure, a non-transparent second surface protective layer is arranged on the active surface of the chip, and a window corresponding to the functional area is arranged on the second surface protective layer.

In a second aspect, a manufacturing method of a package structure according to the embodiment of the disclosure includes: providing a dielectric frame, wherein at least one package cavity is formed in the dielectric frame, first metal posts are arranged on the dielectric frame and located outside the package cavity, and both end surfaces of each first metal post are respectively exposed out of opposite sides of the dielectric frame; packaging a chip to be packaged inside the package cavity to obtain a first semi-finished product, wherein pins on an active surface of the chip face a first surface of the first semi-finished product; manufacturing a circuit layer on the first surface of the first semi-finished product to obtain a second semi-finished product, wherein the circuit layer is directly or indirectly connected to the first metal posts and the pins on the active surface of the chip; and cutting the second semi-finished product to obtain package units with the first side wall bonding pads, wherein at least one cutting path passes through the first metal posts.

The manufacturing method of a package structure according to the embodiment of the disclosure has at least the following beneficial effects.

A package structure can be obtained by the manufacturing method of a package structure according to the embodiment of the disclosure. Compared with the existing package structure, according to the embodiment of the disclosure, first side wall bonding pads that can be immersed with solder are provided, the circuit layer is led out via the pins of the chip, bonding wires or metal bumps are omitted, the package size is reduced, and the conduction distance of electric signals is shortened, which facilitates the miniaturization of the package structure, and the optimization for the loss and delay of electric signal conduction. When the first side wall pads are immersed with solder, the solder wettability condition of the first side wall bonding pads can be checked by an automatic optical inspection device so as to judge the quality of the solder and then judge the validity of the chip solder performance, which is beneficial to improving the reliability of related electronic products after assembly, and can meet the requirements of vehicle regulations.

According to some embodiments of the disclosure, manufacturing a circuit layer on the first surface of the first semi-finished product includes: when the pins on the active surface of the chip face and are exposed out of the first surface of the first semi-finished product, manufacturing the circuit layer on the first surface of the first semi-finished product to obtain the second semi-finished product, wherein the circuit layer is directly connected to the pins on the active surface of the chip.

According to some embodiments of the disclosure, manufacturing a circuit layer on the first surface of the first semi-finished product includes: when the pins on the active surface of the chip face the first surface of the first semi-finished product and are buried in the first semi-finished product, forming first via holes in the first surface of the first semi-finished product, wherein the first via holes are communicated with the pins on the active surface of the chip; forming first electrically conductive through-hole posts in the first via holes by electroplating, wherein first ends of the first electrically conductive through-hole posts are connected to the pins on the active surface of the chip, and second ends of the first electrically conductive through-hole posts are exposed out of the first surface of the first semi-finished product; and manufacturing the circuit layer on the first surface of the first semi-finished product to obtain the second semi-finished product, wherein the circuit layer is connected to the first electrically conductive through-hole posts and connected to the pins on the active surface of the chip via the first electrically conductive through-hole posts.

According to some embodiments of the disclosure, the circuit layer is provided in plural, two adjacent circuit layers are connected via third electrically conductive through-hole posts, and an outermost circuit layer is connected to the first metal posts via fourth electrically conductive through-hole posts.

According to some embodiments of the disclosure, manufacturing a circuit layer on the first surface of the first semi-finished product includes: when the pins on the active surface of the chip face the first surface of the first semi-finished product and a heat dissipation surface of the chip is buried in the first semi-finished product, forming second via holes in a second surface of the first semi-finished product, wherein the second via holes are communicated with the heat dissipation surface of the chip; forming first thermally conductive through-hole posts in the second via holes by electroplating, wherein first ends of the first thermally conductive through-hole posts are connected to the heat dissipation surface of the chip, and second ends of the first thermally conductive through-hole posts are exposed out of the second surface of the first semi-finished product; and manufacturing the circuit layer on the first surface of the first semi-finished product, and manufacturing a heat dissipation layer on the second surface of the first semi-finished product to obtain the second semi-finished product, wherein the heat dissipation layer is connected to the first thermally conductive through-hole posts.

According to some embodiments of the disclosure, manufacturing a circuit layer on the first surface of the first semi-finished product includes: when the pins on the active surface of the chip face the first surface of the first semi-finished product and a heat dissipation surface of the chip is exposed out of a second surface of the first semi-finished product, manufacturing the circuit layer on the first surface of the first semi-finished product, and manufacturing a heat dissipation layer on the second surface of the first semi-finished product to obtain the second semi-finished product, wherein the heat dissipation layer is directly connected to the heat dissipation surface of the chip.

According to some embodiments of the disclosure, a functional area is arranged on the active surface of the chip, and packaging a chip to be packaged inside the package cavity includes: providing a temporary bearing surface at a bottom of the package cavity; mounting the chip inside the package cavity, wherein the active surface of the chip is mounted on the temporary bearing surface; packaging the chip with a packaging material; and removing the temporary bearing surface to expose the functional area on the active surface of the chip.

According to some embodiments of the disclosure, after cutting the second semi-finished product, the method further includes: forming a transparent second surface protective layer on the active surface of the chip.

According to some embodiments of the disclosure, after cutting the second semi-finished product is cut, the method further includes: forming a non-transparent second surface protective layer on the active surface of the chip; and opening a window in the second surface protective layer at a position corresponding to the functional area.

In a third aspect, a package structure according to the embodiment of the disclosure is obtained by the manufacturing method of a package structure in the second aspect.

In a fourth aspect, a vertical package module according to the embodiment of the disclosure includes the package structure in the first aspect, or includes the package structure in the third aspect.

In a fifth aspect, a vertical package module according to the embodiment of the disclosure includes: a printed circuit board; package units, each being provided with second side wall bonding pads and soldered on the printed circuit board via the second side wall bonding pads, first surfaces of the package units being perpendicular to the printed circuit board; and packaged devices with a functional area, each of the packaged devices being packaged in a respective one of the package units and electrically connected to the second side wall bonding pads, and a functional area of each of the packaged devices facing a first side of a respective one of the package units.

The vertical package module according to the embodiment of the disclosure has at least the following beneficial effects.

According to the disclosure, the second side wall bonding pads are arranged on the package units, and the surface mounting method of a plane type is changed to a vertical mounting method to reduce the mounting area, so that the miniaturization and high density of the vertical packaging module are facilitated. With the vertical mounting method, the transmission, conduction, reception or detection direction of light, electromagnetic waves, infrared and other signals by the packaged device can be changed from a single direction to more than one optional directions, which is beneficial to achieving related functions such as signal transmission and reception, and is also conducive to reducing the design difficulty of the vertical package module, as well as reducing the process difficulty of vertical assembly, and improving the reliability of board-level assembly.

According to some embodiments of the disclosure, an indentation is formed in a surface or side of the printed circuit board, first bonding pads are arranged in the indentation, and the second side wall bonding pads are connected to the first bonding pads by welding.

According to some embodiments of the disclosure, an upper surface or a lower surface of the printed circuit board is provided with a projecting part.

According to some embodiments of the disclosure, second bonding pads are arranged on the projecting part, each of the package units is further provided with bottom bonding pads, and the bottom bonding pads are connected to the second bonding pads by welding.

Additional aspects and advantages of the disclosure will be set forth, in part, from the following description, and in part will be apparent from the following description, or may be learned by practice of the disclosure.

BRIEF DESCRIPTION OF DRAWINGS

The above and/or additional aspects and advantages of the disclosure will become apparent and readily understood from the following description of embodiments taken in conjunction with the accompanying drawings, wherein.

Figure 21:
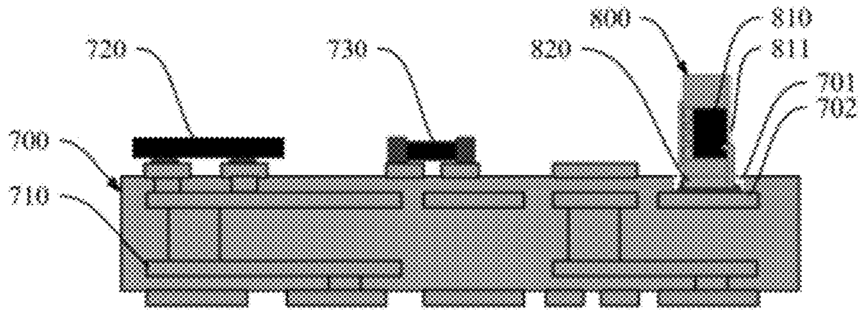
Figure 22A:
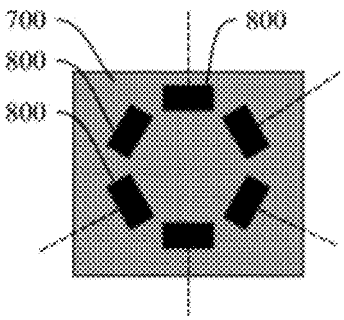
Figure 22B:
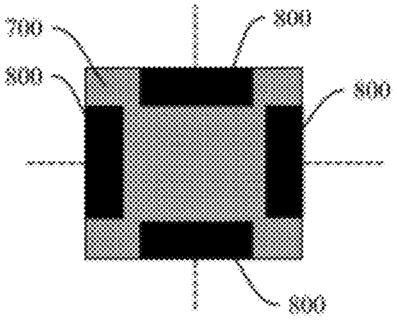
Figure 22C:
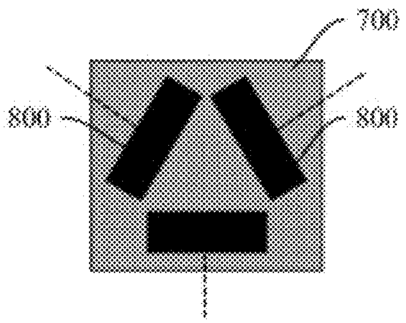
Figure 22D:
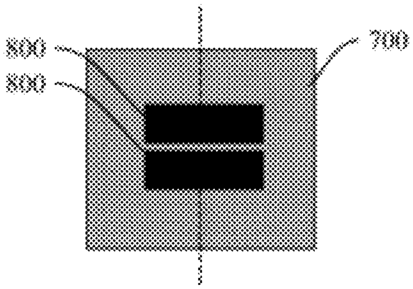
Figure 23:
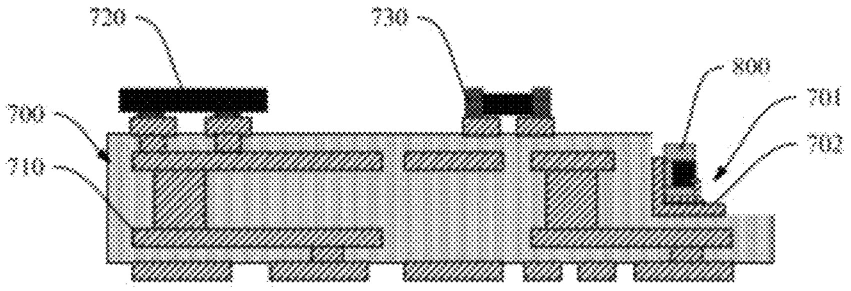
Figure 24:
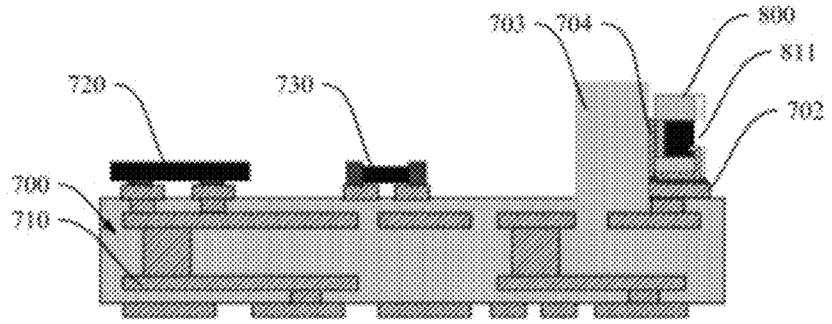

FIG. *8a* is a seventh schematic structural diagram of the package structure according to an embodiment of the disclosure;

FIG. *8b* is the eighth schematic structural diagram of the package structure according to the embodiment of the disclosure;

FIG. *8c* is a ninth schematic structural diagram of the package structure according to an embodiment of the disclosure;

FIG. 9 to FIG. 20 are schematic diagrams of intermediate processes of the manufacturing method of the package structure according to embodiments of the disclosure;

FIG. 21 is a first schematic structural diagram of the vertical package module according to t an he embodiment of the disclosure;

FIG. *22a*, FIG. *22b*, FIG. *22c* and FIG. *22d* are respectively top views of different numbers of package units distributed on the printed circuit board according to an embodiment of the disclosure;

FIG. 23 is a second schematic structural diagram of the vertical package module according to an embodiment of the disclosure; and FIG. 24 is a third schematic structural diagram of the vertical package module according to an embodiment of the disclosure.

DETAILED DESCRIPTION

Embodiments of the disclosure are described in detail below, examples of which are illustrated in the accompanying drawings, wherein the same or similar reference numerals refer to the same or similar elements or elements having the same or similar functions throughout. The embodiments described below with reference to the accompanying drawings are exemplary, only used to explain the disclosure, and should not be construed as a limitation of the disclosure.

In the description of the disclosure, "several" means one or more, "a plurality of" means more than two, "greater than a number", "less than a number", "exceed a number" and the like indicate that the number is excluded, and "above a number", "below a number", "within a number", and the like indicate that the number is included. "First" and "second" if described are only used to distinguish between technical features but cannot be used to indicate or imply relative importance or implicitly specify a quantity of indicated technical features or implicitly specify a sequential relationship of indicated technical features.

In the description of the disclosure, unless otherwise expressly defined, the terms such as "disposed", "mounted", and "connected" should be understood in a broad sense. For persons of ordinary skill in the art, specific meanings of the terms in the disclosure may be appropriately determined with reference to the specific content in the technical solution.

Example Embodiment 1

Figure 1:
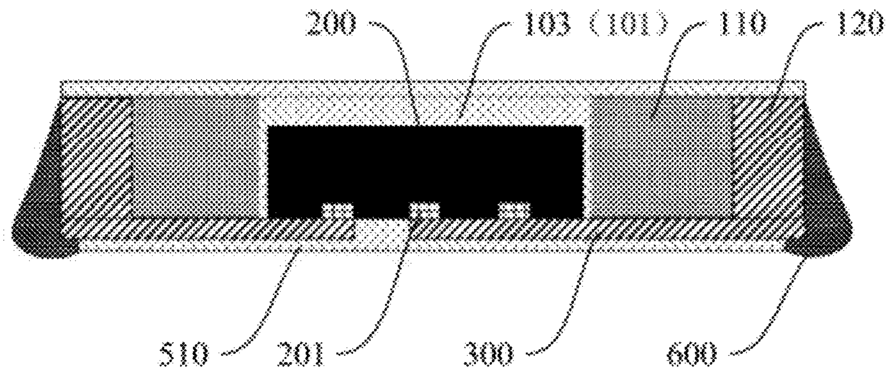
FIG. 1 is a first schematic structural diagram of the package structure according to the embodiment of the disclosure.
Figure 2:
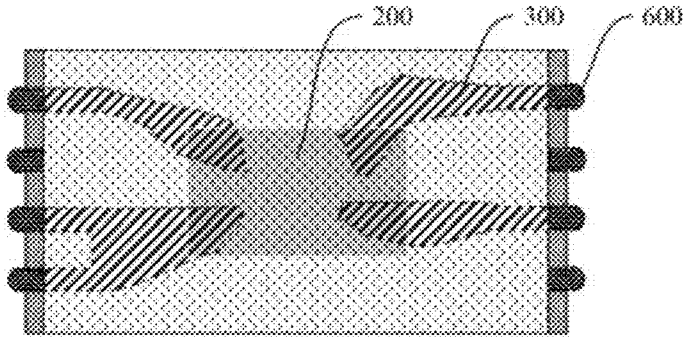
FIG. 2 is the bottom view schematic diagram of the package structure shown in FIG. 1.
Figure 3:
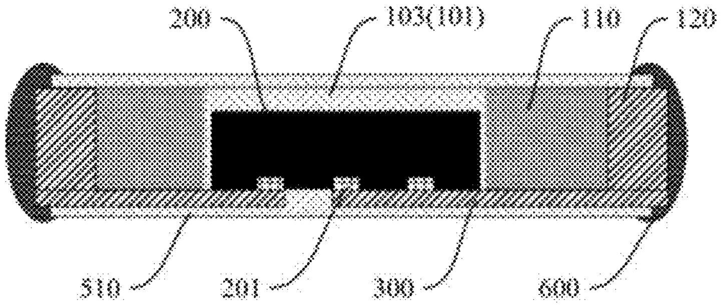
FIG. 3 is a second schematic structural diagram of the package structure according to an embodiment of the disclosure.
Figure 4:
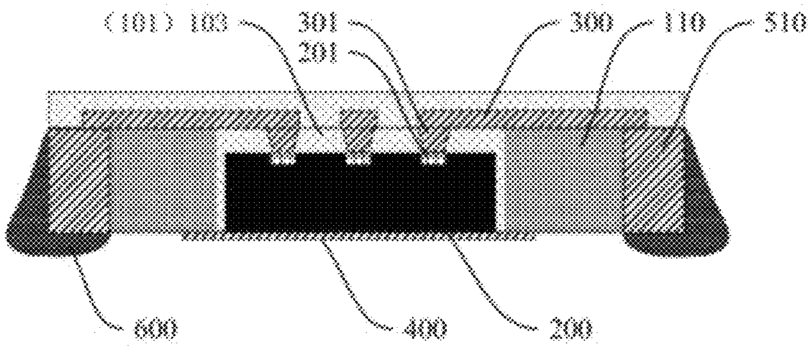
FIG. 4 is a third schematic structural diagram of the package structure according to an embodiment of the disclosure.

Referring to FIG. 1 and FIG. 2, a package structure with a wettable side surface is disclosed according the present embodiment, including a first dielectric layer 110, a chip 200 (also referred to as a microcircuit, a microchip, or an integrated circuit) and a circuit layer 300. The first dielectric layer 110 is made of at least one material including glass fiber cloth, high molecular polymer, or ceramic material. The first dielectric layer 110 is provided with a package cavity 101. Specifically, the package cavity 101 is located in the middle of the first dielectric layer 110. First side wall bonding pads 120 are arranged on the side walls of the first dielectric layer 110 and located at the outer sides of the package cavity 101, the number of the first side wall bonding pads 120 is determined according to the number of pins 201 on an active surface of the chip 200 and the actual wiring requirements. The chip 200 is packaged inside the package cavity 101, and the pins 201 on the active surface of the chip 200 face a first surface of the first dielectric layer 110. The packaging material 103 for packaging the chip 200 may be an Ajinomoto build-up material, a material with a polymer matrix, a photosensitive insulating material, an encapsulation molding compound or polyimide, etc. The packaging material 103 wraps the chip 200 in the package cavity 101 and the chip 200 is partially exposed out of the packaging material 103, so as to achieve an electrical connection or a heat dissipation connection. Referring to FIG. 1, FIG. 3 and FIG. 4, the circuit layer 300 is arranged on the first surface of the first dielectric layer 110 and are directly or indirectly connected to the first side wall bonding pads 120 and the pins 201 on the active surface of the chip 200, so as to realize an electrical connection between the first side wall bonding pads 120 and the pins 201 on the active surface of the chip 200. The pins 201 may face any one of the opposite sides of the first dielectric layer 110. For ease of description, in the embodiment of the disclosure, the orientation of the pins 201 is used as a reference to determine the first surface of the first dielectric layer 110, that is, the surface of the first dielectric layer facing the pins 201 is the first surface.

Compared with the existing package structure, according to the embodiment of the disclosure, the circuit layer 300 is led out via the pins of the chip 200, bonding wires or metal bumps are omitted, the package size is reduced, and the conduction distance of electric signals is shortened, which facilitates the miniaturization of the package structure, and the optimization for the loss and delay of electric signal conduction. Moreover, in the present embodiment, by arranging the first side wall bonding pads 120, more bonding pads can be arranged on the package structure per unit area, so as to meet the requirement of the increasing number of I/Os. With the design of the first side wall bonding pads 120, surface mounting, side mounting or vertical mounting of the package structure can be achieved, therefore, mounting requirements in more scenarios can be met, and the applicability of the package structure is favorably improved. In subsequent use, when the first side wall bonding pads 120 are immersed with solder, the solder wetting condition of the first side wall bonding pads 120 can be checked by an automatic optical inspection device to judge the quality of the solder and then judge the validity of the chip solder performance, which is beneficial to improving the reliability of related electronic products after assembly, and can meet the requirements of vehicle regulations.

Figure 5:
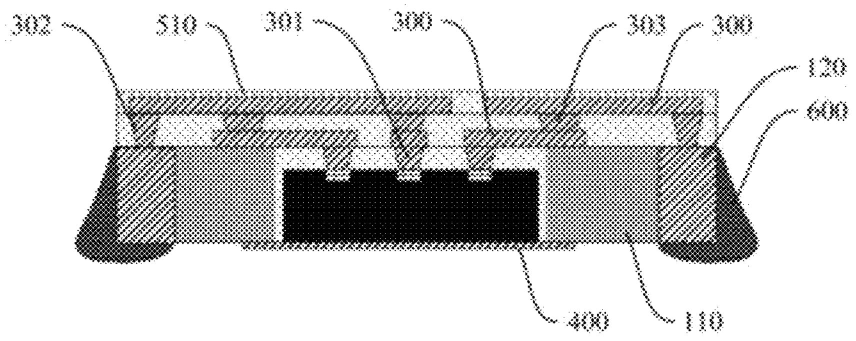
FIG. 5 is a fourth schematic structural diagram of the package structure according to an embodiment of the disclosure.

According to different designs, the circuit layer 300 may be in direct connection or in indirect connection with the first side wall bonding pads 120 and the pins 201 on the active surface of the chip 200. Referring to FIG. 1 or FIG. 3, the circuit layer 300 is shown to be directly connected to the first side wall bonding pads 120 and the pins 201 on the active surface of the chip 200. Referring to FIG. 4, the circuit layer 300 and the first side wall bonding pads 120 are shown to be directly connected, and the circuit layer 300 is shown to be connected to the pins 201 on the active surface of the chip 200 via the first electrically conductive through-hole posts 301. Referring to FIG. 5, the circuit layer 300 is connected to the first side wall bonding pads 120 via the second electrically conductive through-hole posts 302, and the circuit layer 300 is connected to the pins 201 on the active surface of the chip 200 via the first electrically conductive through-hole posts 301. Therefore, in the present embodiment, the circuit layer 300 can be directly connected to the first side wall bonding pads 120 or connected to the first side wall bonding pads 120 via the second electrically conductive through-hole posts 302, and the circuit layer 300 is also directly connected to the pins 201 on the active surface of the chip 200 or connected to the pins 201 on the active surface of the chip 200 via the first electrically conductive through-hole posts 301.

Figure 6:
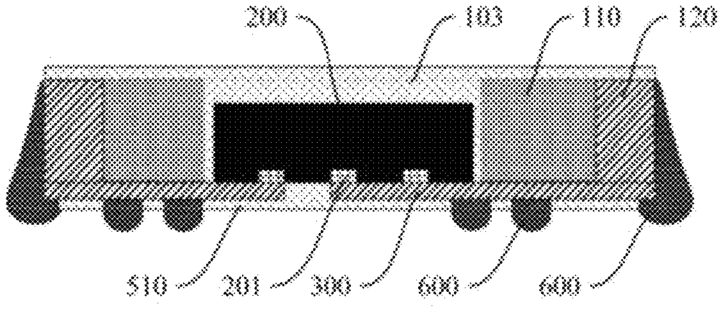
FIG. 6 is a fifth schematic structural diagram of the package structure according to an embodiment of the disclosure.
Figure 7:
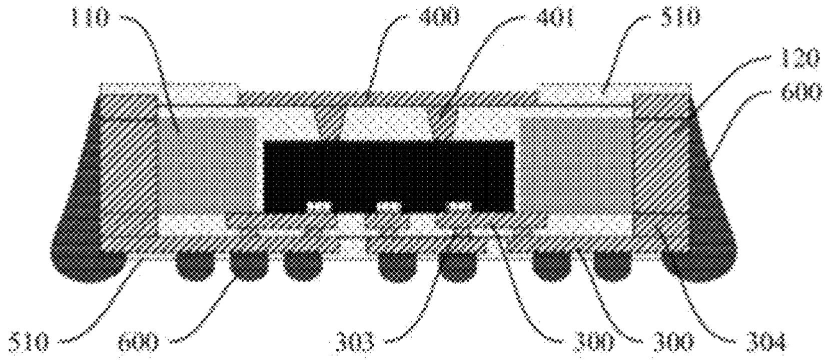
FIG. 7 is a sixth schematic structural diagram of the package structure according to an embodiment of the disclosure.

Referring to FIG. 5, FIG. 6 and FIG. 7, one or more circuit layers 300 are provided, which can meet more wiring requirements. When multiple circuit layers 300 are provided, two adjacent circuit layers 300 are connected via third electrically conductive through-hole posts 303, and the outermost circuit layer 300 is connected to the first side wall bonding pads 120 via the fourth electrically conductive through-hole posts 304.

Referring to FIG. 5 or FIG. 7, a heat dissipation layer 400 is arranged on a second surface of the first dielectric layer 110, which is beneficial to improving the heat dissipation efficiency of the chip 200 and reducing the operating temperature of the chip 200, thereby improving the operating reliability of the chip 200. The heat dissipation layer 400 is directly connected to a heat dissipation surface of the chip 200 or connected to the heat dissipation surface of the chip 200 via first thermally conductive through-hole posts 401. Specifically, referring to FIG. 5, the heat dissipation layer 400 is shown to be directly connected to the heat dissipation surface of the chip 200. Referring to FIG. 7, the heat dissipation layer 400 is shown to be connected to the heat dissipation surface of the chip 200 via the first thermally conductive through-hole posts 401.

Referring to FIG. 5 or FIG. 7, during application, the first side wall bonding pads 120 are placed with solder balls 600, or solder paste is printed on the circuit board to facilitate connection with the circuit board. For some package structures, the circuit layer 300 is provided with bottom bonding pads. According to actual soldering requirements, at least one of the first side wall pads 120 and the bottom pads is placed with the solder balls 600 to facilitate surface mounting, side mounting or vertical mounting.

A first surface protective layer 510 is applied on the package structure in order to protect the package structure. Specifically, the first surface protective layer 510 covers the circuit layer 300. When the heat dissipation layer 400 is provided, the first surface protective layer 510 also covers the heat dissipation layer 400. The first surface protective layer 510 may be a solder resist layer or a plastic encapsulation layer to achieve the functions of mechanical protection and moisture isolation.

Figure 8A:
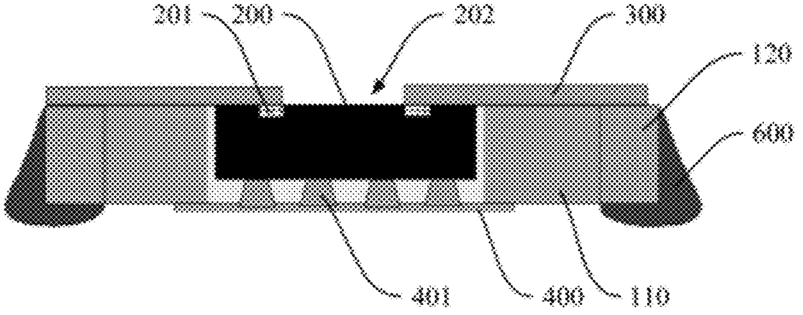

Referring to FIG. 8*a*, in practical applications, the orientation of the active surface of the chip 200 may be different according to different types of the chip 200. For example, when the chip 200 is a component such as an LED, a light receiving device or a sensor chip, a functional area 202 is arranged on the active surface of the chip 200, and the functional area 202 is exposed out of the first dielectric layer 110, that is, the active surface of the chip 200 faces outside of the package cavity 101, thereby facilitating completion of functions such as signal transmission, signal reception, signal conduction or signal detection.

Figure 8B:
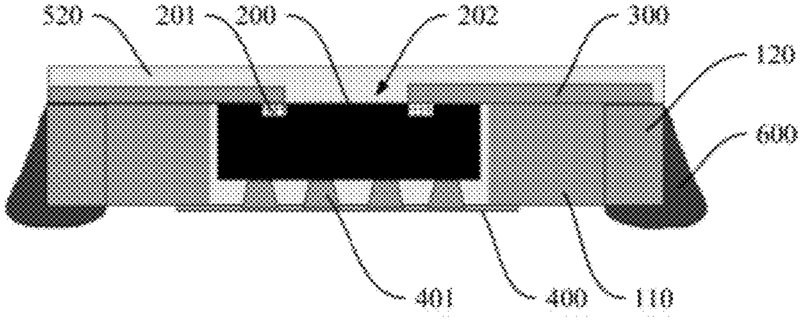

Referring to FIG. 8*b*, for some types of chips, such as chips with waterproof requirements, a transparent second surface protective layer 520 is arranged on the active surface of the chip 200 in order to strengthen the protection of the chip 200. Depending on different materials of the second surface protective layer 520, the second surface protective layer 520 can play different protective functions, such as mechanical protection and moisture isolation.

Figure 8C:
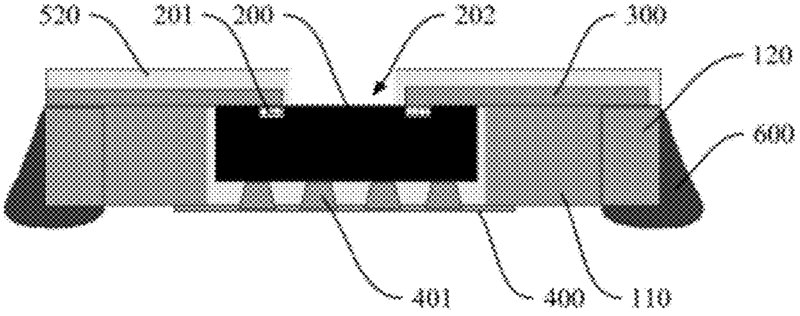

Referring to FIG. 8*c*, depending on the different materials of the second surface protective layer 520, a non-transparent second surface protective layer 520 may be arranged on the active surface of the chip 200, and a window corresponding to the functional area 202 is arranged on the second surface protective layer 520 to avoid the functional area 202, thereby exposing the functional area 202, so as to facilitate completion of functions such as signal transmission, signal reception, signal conduction or signal detection.

Example Embodiment 2

A manufacturing method of the package structure is provided according to the embodiment of the disclosure, including step S100, step S200, step S300 and step S400, and each step will be described in detail below.

Figure 9:
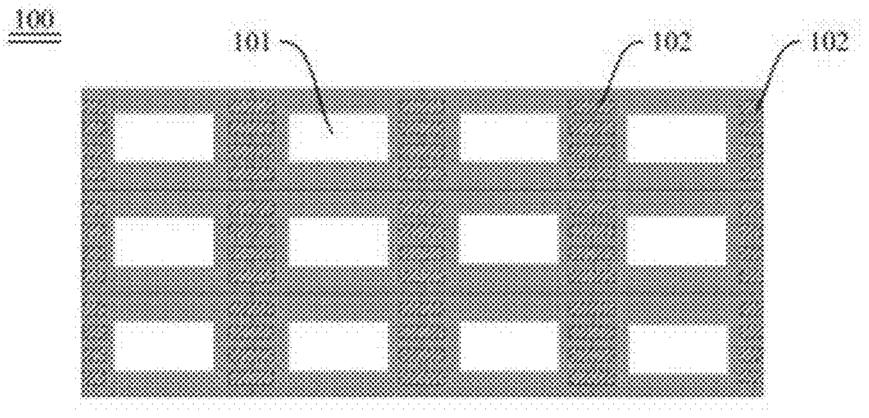
Figure 10:
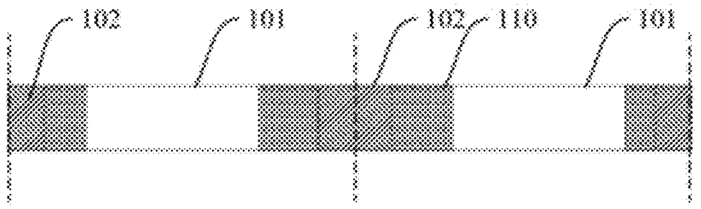

At S100, referring to FIG. 9 and FIG. 10, a dielectric frame 100 is provided and configured for forming the first dielectric layer 110 of the package structure. At least one packaging cavity 101 is formed in the dielectric frame 100, first metal posts 102 are arranged on the dielectric frame 100 and located outside the package cavity 101, and both end surfaces of each first metal post 102 are respectively exposed out of opposite sides of the dielectric frame 100. In the present embodiment, the package cavity 101 is a cavity connecting opposite sides of the dielectric frame 100, and the dielectric frame 100 is made of at least one material selected from a group that includes glass fiber cloth, high molecular polymer or ceramic material. For ease of description, (4*3) 12 package cavities 101 in an array are formed in the dielectric frame 100 in the present embodiment. In the same row, first metal posts 102 are arranged on the dielectric frame 100 and located between adjacent package cavities 101, and first metal posts 102 are also arranged on both side walls of the dielectric frame 100 and located on the sides of the package cavities 101.

Figure 11:
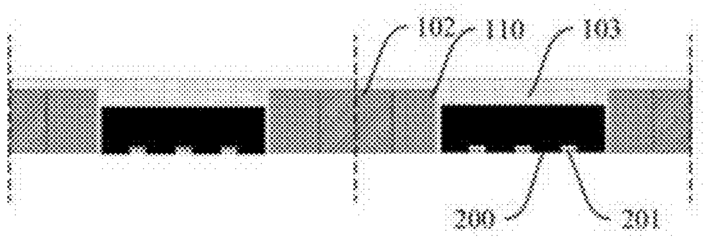

At S200, referring to FIG. 11, the chip 200 to be packaged is packaged inside each of the package cavities 101 to obtain a first semi-finished product, wherein the pins 201 on the active surface of the chip 200 face a first surface of the first semi-finished product. The package method of the chip 200 may be completed by lamination, injection molding or calendering process, etc., wherein the packaging material 103 used to package the chip 200 may be an Ajinomoto build-up material, a material with a polymer matrix, a photosensitive insulating material, a packaging molding compound or polyimide, etc., and the packaging material 103 wraps the chip 200 in the package cavity 101 and the chip 200 is partially exposed out of the packaging material 103 to facilitate an electrical connection or a heat dissipation connection.

Figure 12:
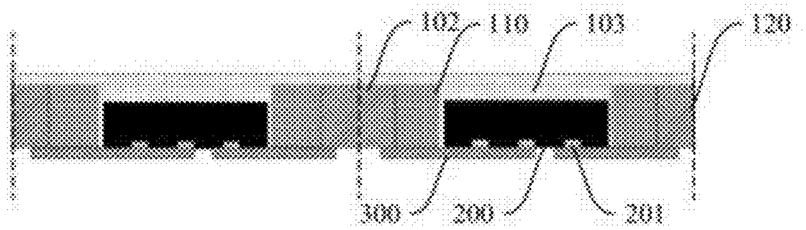

At S300, referring to FIG. 12, the circuit layer 300 is fabricated on the first surface of the first semi-finished product to obtain a second semi-finished product, wherein the circuit layer 300 are directly or indirectly connected to the first metal posts 102 and the pins 201 on the active surface of the chip 200, so as to realize an electrical connection between the first metal posts 102 and the pins 201 on the active surface of the chip 200. Compared with the existing package structure, according to the embodiment of the disclosure, the circuit layer 300 is led out via the pins of the chip 200, bonding wires or metal bumps are omitted, the package size is reduced, and the conduction distance of electric signals is shortened, which facilitates the miniaturization of the packaging structure, and the optimization for the loss and delay of electric signal conduction.

At S400, referring to FIG. 12, the second semi-finished product is cut to obtain package units with the first side wall bonding pads 120, wherein at least one cutting path passes through the first metal posts 102, and the cutting method may be laser cutting or mechanical cutting. For two adjacent packaging cavities 101 on the same row, the central connection line of the first metal posts 102 in the same column (as shown by the dotted line in the figure) is defined as the cutting path. By cutting along the cutting path, the cross sections of the first metal posts 102 can be exposed out of the surface of the dielectric frame 100 to form the first side wall bonding pads 120, and then the semi-finished product that has been cut once is cut into two equal parts to obtain package units. With the design of the first side wall bonding pads 120, more bonding pads can be arranged on the package structure per unit area, so as to meet the requirement of the increasing number of I/Os. With the design of the first side wall bonding pads 120, surface mounting, side mounting or vertical mounting of the package structure can be achieved, mounting requirements in more scenarios can be met, thereby being beneficial to improving the applicability of the package structure.

For the process of manufacturing the circuit layer 300 on the first surface of the first semi-finished product in step S300, there are two implementations. In the first implementation, manufacturing the circuit layer 300 on the first surface of the first semi-finished product includes a step S310.

At S310, referring to FIG. 11 and FIG. 12, when the pins 201 on the active surface of the chip 200 face and are exposed out of the first surface of the first semi-finished product, the circuit layer 300 is fabricated on the first surface of the first semi-finished product to obtain a second semi-finished product, wherein the circuit layer 300 is directly connected to the pins 201 on the active surface of the chip 200. In the process of mounting the chip 200, the pins 201 on the active surface of the chip 200 may face and be exposed out of the first surface of the first semi-finished product by providing a temporary bearing surface at the bottom of the package cavity 101. In addition, the manufacturing method of the circuit layer 300 can be realized by pattern transfer and pattern electroplating, which are well-known technologies to those having ordinary skills in the art, and will not be repeated in the present embodiment.

In the second implementation, manufacturing the circuit layer 300 on the first surface of the first semi-finished product includes steps S321-S323.

Figure 13:
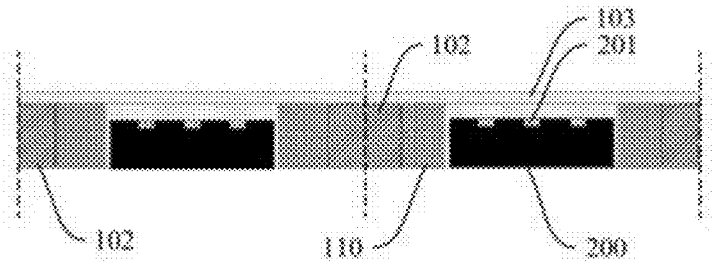
Figure 14:
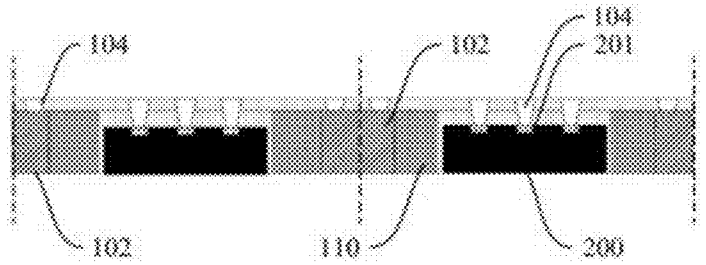

At S321, referring to FIG. 13 and FIG. 14, when the pins 201 on the active surface of the chip 200 face the first surface of the first semi-finished product and are buried in the first semi-finished product, first via holes 104 are formed in the first surface of the first semi-finished product, and the first via holes 104 are communicated with the pins 201 on the active surface of the chip 200. In the present embodiment, the first via holes 104 are obtained by laser drilling.

Figure 15:
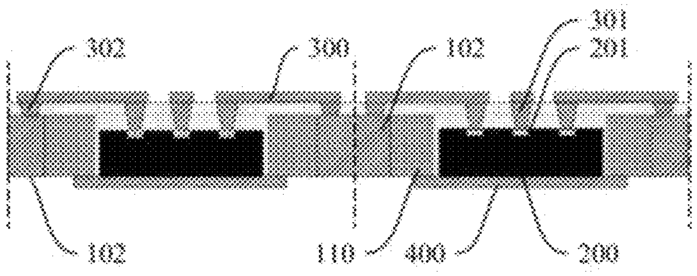

At S322, referring to FIG. 15, the first electrically conductive through-hole posts 301 are formed in the first via holes 104 by electroplating, wherein first ends of the first electrically conductive through-hole posts 301 are connected to the pins 201 on the active surface of the chip 200, and second ends of the first electrically conductive through-hole posts 301 are exposed out of the first surface of the first semi-finished product.

At S323, referring to FIG. 15, the circuit layer 300 is fabricated on the first surface of the first semi-finished product to obtain a second semi-finished product, wherein the circuit layer 300 is connected to the first electrically conductive through-hole posts 301 and connected to the pins 201 on the active surface of the chip 200 via the first electrically conductive through-hole posts 301. With such arrangement, the pins 201 on the active surface of the chip 200 can be packaged in the packaging material 103, and the electrical connection between the chip 200 and the first metal posts 102 can also be realized, which is beneficial to reducing the influence of water vapor on the chip 200, and improving the operating stability of the chip 200.

When the packaging material 103 is relatively thick, referring to FIG. 14, in step S321, one or more first via holes 104 are formed and are correspondingly communicated with the metal posts 102 and the pins 201 on the active surface of the chip 200. Correspondingly, referring to FIG. 15, in step S322, the second electrically conductive through-hole posts 302 and the first electrically conductive through-hole posts 301 are respectively formed in the corresponding first via holes 104 by electroplating, wherein first ends of the second electrically conductive through-hole posts 302 are connected to the first metal posts 102, the first ends of the first electrically conductive through-hole posts 301 are connected to the pins 201 on the active surface of the chip 200, and the second ends of the second electrically conductive through-hole posts 302 and the second ends of the first electrically conductive through-hole posts 301 both are exposed out of the first surface of the first semi-finished product. In step S323, after the circuit layer 300 is manufactured on the first surface of the semi-finished product, the circuit layer 300 is respectively connected to the second electrically conductive through-hole posts 302 and the first electrically conductive through-hole posts 301, so that the circuit layer 300 are connected to the first metal posts 102 via the second electrically conductive through-hole posts 302, and the circuit layer 300 are connected to the pins 201 on the active surface of the chip 200 via the first electrically conductive through-hole posts 301, thereby realizing that the circuit layer 300 is indirectly connected to the first metal posts 102 and the pins 201 on the active surface of the chip 200 respectively.

Figure 16:
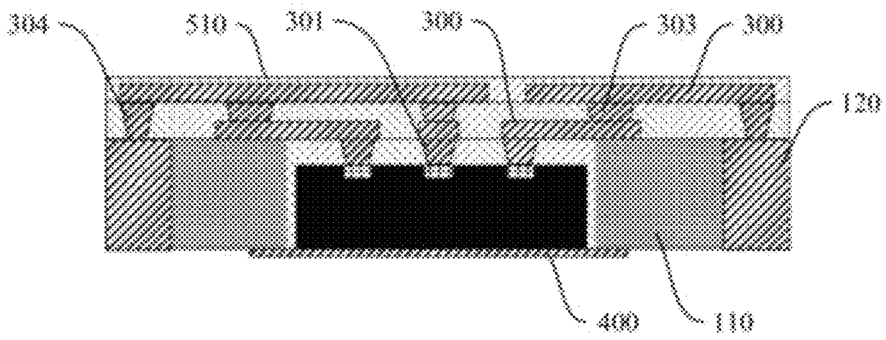

Referring to FIG. 16, in the present embodiment, multiple circuit layers 300 are provided, two adjacent circuit layers 300 are connected via third electrically conductive through-hole posts 303, and the outermost circuit layer 300 is connected to the first metal posts 102 via fourth electrically conductive through-hole posts 304, wherein the m method of the circuit layers 300 can be realized by processes such as pattern transfer, pattern electroplating, lamination and pressing. Similarly, the processing methods of the third electrically conductive through-hole posts 303 and the fourth electrically conductive through-hole posts 304 can also be realized by processes such as pattern transfer, pattern electroplating, lamination and pressing, which are well-known technologies to those having ordinary skills in the art, and will not be repeated in this embodiment. By such arrangement, a multi-layer fan-out package structure can be manufactured according to the present embodiment, facilitating the improvement of the wiring density.

In order to improve the heat dissipation efficiency of the chip 200, the heat dissipation layer 400 may be processed on the first semi-finished product, wherein the heat dissipation layer 400 may be simultaneously manufactured in step S300, wherein the present embodiment provides two implementations.

In the first implementation, in the above-mentioned step S300, manufacturing the circuit layer 300 on the first surface of the first semi-finished product include the steps as follow.

Figure 17:
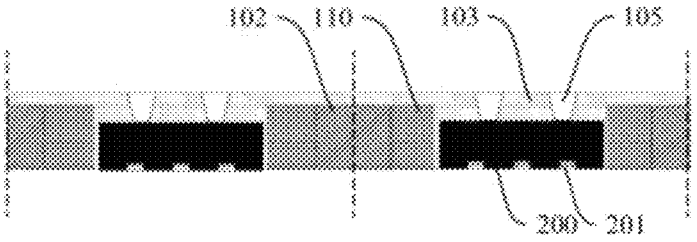

Referring to FIG. 17, when the pins 201 on the active surface of the chip 200 face the first surface of the first semi-finished product and the heat dissipation surface of the chip 200 is buried in the first semi-finished product, second via holes 105 are formed in the second surface of the first semi-finished product, and the second via holes 105 are communicated with the heat dissipation surface of the chip 200. In the present embodiment, the heat dissipation surface of the chip 200 is located on the back surface of the chip 200, and the heat dissipation surface of the chip 200 and the pins 201 on the active surface of the chip 200 are respectively located on opposite sides of the chip 200.

Figure 18:
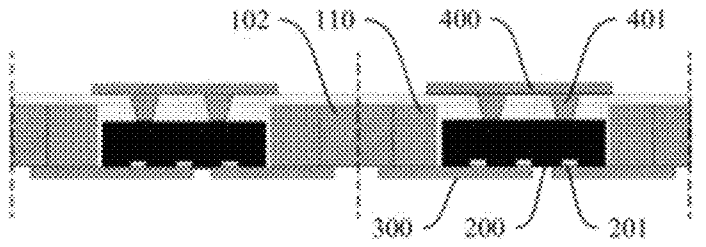

Referring to FIG. 18, first thermally conductive through-hole posts 401 are formed in the second via holes 105 by electroplating, wherein first ends of the first thermally conductive through-hole posts 401 are connected to the heat dissipation surface of the chip 200, and second ends of the first thermally conductive through-hole posts 401 are exposed out of the second surface of the first semi-finished product.

Referring to FIG. 18, the circuit layer 300 is fabricated on the first surface of the first semi-finished product, and a heat dissipation layer 400 is fabricated on the second surface of the first semi-finished product, so as to obtain the second semi-finished product, wherein the heat dissipation layer 400 is connected to the first thermally conductive through-hole posts 401. The manufacturing method of the heat dissipation layer 400 may be realized by means of pattern transfer and image electroplating, which will not be repeated in this embodiment.

In the second implementations, in the above-mentioned step S300, manufacturing the circuit layer 300 on the first surface of the first semi-finished product includes the steps as follows.

Referring to FIG. 14 and FIG. 15, when the pins 201 on the active surface of the chip 200 face the first surface of the first semi-finished product and the heat dissipation surface of the chip 200 is exposed out of the second surface of the first semi-finished product, the circuit layer 300 is fabricated on the first surface of the first semi-finished product, and the heat dissipation layer 400 is fabricated on the second surface of the first semi-finished product to obtain the second semi-finished product, wherein the heat dissipation layer 400 is directly connected to the heat dissipation surface of the chip 200. The manufacturing method of the circuit layers 300 may refer to the above-mentioned implementation, which will not be repeated here.

After the circuit layer 300 IS manufactured on the first surface of the first semi-finished product in the above-mentioned step S300, the method further includes the steps as follows.

Figure 19:
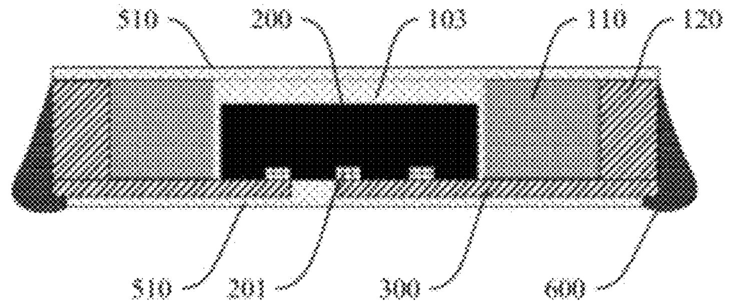
Figure 20:
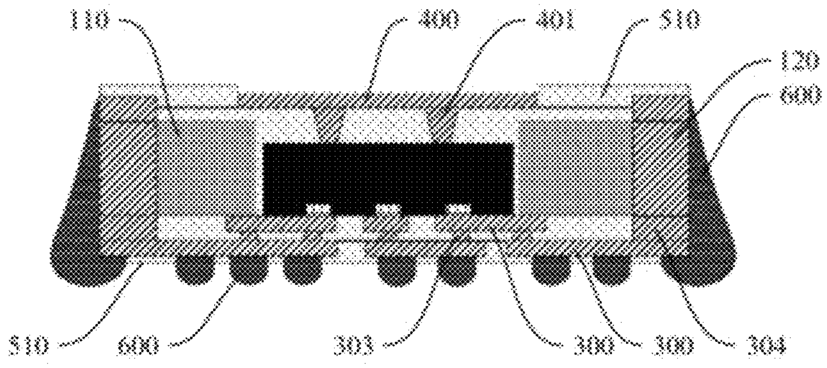

Referring to FIG. 19 or FIG. 20, a first surface protective layer 510 is applied on the first semi-finished product to obtain a second semi-finished product, wherein the first surface protective layer 510 may be a solder resist layer or a plastic encapsulation layer to achieve the functions of mechanical protection and moisture isolation. In case that the heat dissipation layer 400 is included, the first surface protective layer 510 is partially removed by a pattern transfer process and a plasma etching or laser process to expose the corresponding heat dissipation metal. The plastic encapsulation material of the first surface protective layer 510 may be the packaging material 103.

Referring to FIG. 19 or FIG. 20, after the packaging units are obtained, ball placement may be performed on the first side wall bonding pads 120 to form connection structures on the first side wall bonding pads 120. For some package structures, the circuit layer 300 is provided with bottom bonding pads, and a window for exposing the bottom bonding pads is arranged on the first surface protective layer 510. In this case, ball placement may be performed on the first side wall bonding pads 120 and the bottom bonding pads to form a connection structure on the first side wall pads 120 and the bottom pads.

In practical applications, depending on different type selections of the chip 200, the orientation of the active surface of the chip 200 may be different. For example, when the chip 200 is a component such as an LED, a light receiving device or a sensor chip, the active surface of the chip 200 is provided with the functional area 202.

In order to expose the functional area 202 out of the first dielectric layer 110, the above-mentioned step S200 in which the chip 200 to be packaged is packaged inside the package cavities 101 includes the steps as follows.

At S210, a temporary bearing surface is provided (not shown in figures) at the bottom of the package cavity 101, wherein the temporary bearing surface may be a temporary bearing plate disposed at the bottom of the dielectric frame 100, or the temporary bearing surface may be an adhesive tape pasted on the bottom of the dielectric frame 100.

At S220, the chip 200 is mounted inside the package cavity 101, the active surface of the chip 200 is mounted on the temporary bearing surface, so that the active surface of the chip 200 can be flush with the bottom of the dielectric frame 100, that is, flush with the surface of the first dielectric layer 110.

At S230, the chip 200 is packaged with the packaging material 103. Since the active surface of the chip 200 is mounted on the temporary bearing surface, the packaging material 103 can avoid the active surface of the chip 200 during packaging, thereby preventing the packaging material 103 from completely covering the chip 200.

At S240, the temporary bearing surface is removed to expose the functional area 202 on the active surface of the chip 200. Since the active surface of the chip 200 is mounted on the temporary bearing surface, the active surface of the chip 200 can be exposed after the temporary bearing surface is removed, and the packaged structure may refer to FIG. 8*a*. When pins 201 are arranged on the active surface of the chip 200, the pins 201 can also be exposed out of the first dielectric layer 110. In order to protect the chip 200, after the second semi-finished product is cut in the above-mentioned step S400, the method further includes the steps as follows.

At S520, a transparent second surface protective layer 520 is formed on the active surface of the chip 200, the structure of which may refer to FIG. 8*b*.

In the above-mentioned step S400, the second surface protective layer 520 may be formed in a different way depending on the different materials of the second surface protective layer 520. For example, after the second semi-finished product is cut, the method further includes the steps as follows.

At S521, a non-transparent second surface protective layer 520 is formed on the active surface of the chip 200; and At S522, a window is formed in the second surface protective layer 520 and corresponds to the position of the functional area 202, the structure of which may refer to FIG. 8*c*. The functional area 202 can be avoided to expose the functional area 202 to facilitate completion of functions such as signal transmission, signal reception, signal conduction and signal detection.

Example Embodiment 3

A package structure is disclosed according to the embodiment of the disclosure, which is obtained by the manufacturing method of the package structure in the Example Embodiment 2. Compared with the existing package structure, according to the embodiment of the disclosure, the circuit layer 300 is led out via the pins of the chip 200, bonding wires or metal bumps are omitted, the package size is reduced, and the conduction distance of electric signals is shortened, which facilitates the miniaturization of the package structure, and the optimization for the loss and delay of electric signal conduction. Moreover, in the present embodiment, by arranging the first side wall bonding pads 120, more pads can be arranged on the package structure per unit area, so as to meet the requirement of the increasing number of I/Os. With the design of the first side wall bonding pads 120, surface mounting, side mounting or vertical mounting of the package structure can be realized, and mounting requirements in more scenarios can be met, thereby favorably improving the applicability of the package structure. In subsequent applications, when the first side wall bonding pads 120 are immersed with solder, the solder wettability condition of the first side wall bonding pads 120 can be checked by an automatic optical inspection device to judge the quality of the solder and then judge the validity of the chip solder performance, which is beneficial to improving the reliability of related electronic products after assembly, and can meet the requirements of vehicle regulations.

Example Embodiment 4

A vertical package module is disclosed according to the embodiment of the disclosure, including the package structure in Example Embodiment 1, or including the package structure in Example Embodiment 3. According to the embodiment of the disclosure, the circuit layer 300 is led out via the pins on the active surface of the chip 200, bonding wires or metal bumps are omitted, the package size is reduced, and the conduction distance of electric signals is shortened, which facilitates the miniaturization of the package structure, and the optimization for the loss and delay of electric signal conduction. Moreover, in the present embodiment, by arranging the first side wall bonding pads 120, more pads can be arranged on the package structure per unit area, so as to meet the requirement of the increasing number of I/Os. With the design of the first side wall bonding pads 120, surface mounting, side mounting or vertical mounting of the package structure can be realized, and mounting requirements in more scenarios can be met, thereby favorably improving the applicability of the package structure.

Example Embodiment 5

Referring to FIG. 21, a vertical package module is disclosed according to the embodiment of the disclosure, including a printed circuit board 700, package units 800 and packaged devices 810, wherein each of the package units 800 is provided with second side wall bonding pads 820 and soldered on the printed circuit board 700 by the second side wall bonding pads 820. A first surface of the package unit 800 is perpendicular to the printed circuit board 700, and the packaged device 810 has a functional area 811, wherein the functional area 811 corresponds to the functional area 202 in the Example Embodiment 1, that is, the functional area 811 may be a signal transmitting end, a signal receiving end, a signal conducting end or a signal detecting end. The functional area 811 may also be a signal transceiving end integrating a signal transmitting end and a signal receiving end. The functional area 811 is exposed to the air and can also be protected by being covered with a protective material. The packaged device 810 is packaged inside the package unit 800 and is electrically connected to the second side wall bonding pads 820, and the functional area 811 of the packaged device 810 faces the first surface of the packaging unit 800, so that the signal conduction direction of the packaged device 810 can be parallel or substantially parallel to the virtual plane in which the printed wiring board 700 is located. The functional area 811 may face any one of the two opposite surfaces of the package unit 800. For ease of description, according to the embodiment of the disclosure, the first surface of the package unit 800 is determined by taking the orientation of the functional area 811 as a reference, that is, a surface of the package units 800 facing the functional area 811 is defined as the first surface. The "signal conduction direction" involved in the present embodiment refers to the conduction of a signal (such as an optical signal) sent or received by the packaged device 810 along a virtual straight path, and the direction of the straight path is the signal conduction direction. The "substantially parallel" involved in the present embodiment refers to that an included angle between the signal conduction direction of the packaged device 810 and the virtual plane where the printed circuit board 700 is located is within a certain error range, for example, less than or equal to 3 degrees or less than or equal to 5 degrees. The package unit 800 in the present embodiment is vertically assembled on the printed circuit board 700 to provide the packaged device 810 with a vertical assembly structure that actively dissipates heat at the front surface, back surface and side surfaces simultaneously, which is beneficial to improving the heat dissipation efficiency of the packaged device 810.

In order to avoid repetition, the specific structure of the package units 800 in the present embodiment may refer to Example Embodiment 1, for example, the circuit layer is led out via the pins of the packaged device 810, bonding wires or metal bumps are omitted, the package size is reduced, and the conduction distance of electric signals is shortened, which facilitates the miniaturization of the packaging structure, and the optimization for the loss and delay of electric signal conduction. For another example, a heat dissipation layer is arranged on the package unit 800 and is directly or indirectly connected to the packaged device 810 for improving the heat dissipation efficiency of the packaged device 810. In the vertical assembly structure of the present embodiment, the heat dissipation layer disposed on the front surface or back surface of the packaged device 810 can be exposed to the air, and subsequent active heat dissipation can be performed by means of air cooling or water cooling, which is beneficial to improving the heat dissipation efficiency. In the present embodiment, the packaged device 810 may be an LED, a light receiving device, a sensor chip, or the like. Traces 710 and/or bonding pads are arranged inside or on the surface of the printed circuit board 700, other components may also be mounted on the printed circuit board 700, for example, an active device 720 (such as a chip or a switch tube) and a passive device 730 (such as a resistor or capacitor), and the components are connected by the traces 710. When the packaged device 810 is an optical transceiver and the active device is an application specific integrated circuit (ASIC) of the optical transceiver, the optical transceiver and ASIC thereof can be integrated.

For a conventional package unit packaged with a packaged device, the functional area 811 of the packaged device generally faces the front of the package unit, and the bonding pads of the package unit are generally arranged at the bottom. Therefore, after the package unit is mounted on the printed circuit board by a surface mounting technology, the signal conduction direction of the packaged device can only be perpendicular to the virtual plane where the printed circuit board is located, resulting in a single signal conduction direction of the packaged device. Moreover, due to structural design, production process and other factors, the package unit is generally in a cuboid structure, usually a larger side is connected to the printed circuit board, resulting in a large mounting area.

In the present embodiment, by arranging the second side wall bonding pads 820 on the package unit 800, the plane surface mounting method is changed to a vertical mounting method to reduce the mounting area, which is beneficial to the miniaturization and high density of the vertical package module. In addition, with the vertical mounting method, the direction of transmission, conduction, reception or detection of light, electromagnetic waves, infrared and other signals by the packaged device 810 can be changed from a single direction to one or more optional directions. For example, referring to FIG. 22*a*, FIG. 22*b*, FIG. 22*c* and FIG. 22*d*, these figures respectively show the arrangement of 6, 4, 3 and 2 package units 800, the dotted line in the figures represents the signal conduction direction, and the signal conduction direction is parallel to the virtual plane where the printed circuit board 700 is located. By adjusting the number of package units 800 and the orientation of the mounting, mounting arrays (such as LED arrays or antenna arrays) in one or more orientations can be realized, which is conducive to achieving related functions such as signal transmission and reception, and is also conducive to reducing the design difficulty of the vertical package module and the process difficulty of vertical assembly, and improving the reliability of board-level assembly.

Referring to FIG. 21 or FIG. 23, an indentation 701 is formed in the surface or side of the printed circuit board 700, first bonding pads 702 are arranged in the indentation 701, and the second side wall bonding pads 820 are connected to the first bonding pads 702 by welding. For example, referring to FIG. 21, the indentation 701 shown in the figure is of a groove structure, the first bonding pads 702 are arranged in the groove, and after the package unit 800 is mounted, a gap in the groove is filled with liquid filler, and the filler is cured by thermal curing or light curing to improve the mounting stability of the package unit 800. For another example, referring to FIG. 23, the indentation 701 shown in the figure is a cutaway indentation arranged at the edge of the printed circuit board 700, and the first bonding pads 702 are arranged in the cutaway indentation, wherein the first bonding pads 702 are flat bonding pads or right-angle bonding pads. When the first bonding pads 702 are right-angle pads, the package unit 800 is further provided with bottom bonding pads, and the second side wall bonding pads 820 and the bottom bonding pads of the package units 800 are respectively connected by welding to the right-angle pads, so as to improve the mounting stability of the package units 800.

Referring to FIG. 24, a projecting part 703 is arranged on the surface of the printed circuit board 700, wherein the projecting part 703 may be of a structure such as a column, a boss or a vertical wall, second bonding pads 704 are arranged on the side wall of the projecting part 703, the package unit 800 is further provided with bottom bonding pads, and the bottom bonding pads are connected to the second bonding pads 704 by welding. In this way, the second side wall bonding pads 820 are connected to the first bonding pads 702 by welding, and the bottom bonding pads are connected to the second bonding pads 704 by welding, so that the mounting stability of the package unit 800 can be improved, and the three-dimensional space can be fully utilized to increase the wiring area, thereby improving the integration density of components. The projecting part 703 has one or more side walls, and according to the design layout requirements, the second bonding pads 704 may be arranged on one or more side walls of the projecting part 703 for mounting one or more package units 800.

The embodiments of the disclosure are described in detail above in conjunction with the accompanying drawings, but the disclosure is not limited to the above-mentioned embodiments, and within the scope of knowledge possessed by those of ordinary skill in the art, various varieties may also be made without departing from the gist of the disclosure.

The invention claimed is:

1. A vertical package module, comprising:

a printed circuit board;

package units, each being provided with second outermost side wall bonding pads and soldered on the printed circuit board via the second outermost side wall bonding pads, first surfaces of the package units being perpendicular to the printed circuit board; and packaged devices with a functional area, each of the packaged devices being packaged in a respective one of the package units and electrically connected to the second outermost side wall bonding pads, and a functional area of each of the packaged devices facing a respective first surface of a respective one of the package units and being exposed to facilitate completion of functions of signal transmission, signal reception, signal conduction and signal detection, wherein an indentation is formed in a surface or side of the printed circuit board, first bonding pads are arranged in the indentation, and the second outmost side wall bonding pads are connected to the first bonding pads by welding.

2. A vertical package module, comprising:

a printed circuit board;

package units, each being provided with second outmost side wall bonding pads and soldered on the printed circuit board via the second outmost side wall bonding pads, first surfaces of the package units being perpendicular to the printed circuit board; and packaged devices with a functional area, each of the packaged devices being packaged in a respective one of the package units and electrically connected to the second outmost side wall bonding pads, and a functional area of each of the packaged devices facing a respective first surface of a respective one of the package units and being exposed to facilitate completion of functions of signal transmission, signal reception, signal conduction and signal detection, wherein an upper surface or a lower surface of the printed circuit board is provided with a projecting part, wherein second bonding pads are arranged on the projecting part, each of the package units is further provided with bottom bonding pads, and the bottom bonding pads are connected to the second bonding pads by welding.

* * * * *